(12) United States Patent
Tai et al.

(10) Patent No.: US 6,787,968 B2
(45) Date of Patent: Sep. 7, 2004

(54) FREESTANDING POLYMER MEMS STRUCTURES WITH ANTI STICTION

(75) Inventors: Yu-Chong Tai, Pasadena, CA (US); Tze-Jung Yao, Pasadena, CA (US); Xing Yang, San Diego, CA (US)

(73) Assignee: California Institute of Technology, Pasadena, CA (US)

( * ) Notice: Subject to any disclaimer, the term of this patent is extended or adjusted under 35 U.S.C. 154(b) by 79 days.

(21) Appl. No.: 09/682,593

(22) Filed: Sep. 25, 2001

(65) Prior Publication Data

US 2002/0070634 A1 Jun. 13, 2002

Related U.S. Application Data

(60) Provisional application No. 60/235,384, filed on Sep. 25, 2000.

(51) Int. Cl.[7] .................................................. H02N 1/00
(52) U.S. Cl. ........................ 310/309; 438/52; 200/181; 216/79; 216/11
(58) Field of Search ..................... 310/309; 200/181; 216/2, 11, 79; 438/52; 73/514.23, 514.36

(56) References Cited

U.S. PATENT DOCUMENTS

| | | | | |
|---|---|---|---|---|
| 5,679,436 A | * | 10/1997 | Zhao | 428/141 |
| 5,771,902 A | | 6/1998 | Lee et al. | 128/897 |
| 6,087,638 A | | 7/2000 | Silverbrook | 219/540 |
| 6,156,216 A | | 12/2000 | Manalis et al. | 236/11 |
| 6,218,209 B1 | * | 4/2001 | Chan et al. | 438/52 |
| 6,249,747 B1 | | 6/2001 | Binnig et al. | 702/33 |
| 6,404,028 B1 | * | 6/2002 | Hetrick et al. | 257/415 |
| 6,511,859 B1 | * | 1/2003 | Jiang et al. | 438/48 |

* cited by examiner

*Primary Examiner*—Karl Tamai
(74) *Attorney, Agent, or Firm*—Fish & Richardson P.C.

(57) ABSTRACT

An anti stiction structure for cantilever formation technique. In one embodiment, the polymer cantilever is prevented from sticking to the substrate by at amortized stick layer on the substrate during formation that is later removed as a sacrificial layer. In another embodiment, the cantilever includes downwardly extending legs.

18 Claims, 3 Drawing Sheets

FREESTANDING POLYMER MEMS STRUCTURES WITH ANTI STICTION

CROSS REFERENCE TO RELATED APPLICATIONS

The present application claims priority from provisional application No. 60/235,384, filed Sep. 25, 2000.

STATEMENT AS TO FEDERALLY-SPONSORED RESEARCH

U.S. Government may have certain rights in this invention pursuant to Grant No. EEC-9402726 awarded by National Science Foundation.

BACKGROUND OF INVENTION

Integrated circuit materials and processing technologies enable forming multiple different kinds of MEMS sensors and actuators. MEMS fabrication may leverage off established processing technologies which are used to form semiconductor materials and structures. Importantly, this may also allow integration of micromechanical devices on the same chip that holds the electronics.

Polymer materials may be used as part of the MEMS structural materials, to obtain certain advantages. Biocompatibility of certain polymers may allow use of such structures in the biotechnology industry. Such polymers may also be formed at lower temperatures then other semiconductor devices, enabling operation over a lower temperature range.

In a polymer surface micromachined process, a specified polymer, such as Parylene, may be used as a structural layer. A sacrificial photoresist layer may hold Parylene in its desired location. Acetone may be used as a releasing agent. Although Parylene structures have been fabricated in this way, it may be difficult to form freestanding devices at a sufficiently small-scale.

SUMMARY OF INVENTION

The present invention teaches anti stick technology to be used in MEMS formation. The anti stick technology may prevent a polymer cantilever from sticking to the substrate. In one embodiment, the anti stick technology includes a sacrificial layer that prevents sticking. In another embodiment, either one or a number of legs extend from the polymer cantilever to the substrate and are freed after formation.

BRIEF DESCRIPTION OF DRAWINGS

These and other aspects will now be described in detail with reference to the accompanying drawings, wherein.

DETAILED DESCRIPTION

The present inventors have found that the polymers used in this kind of process, such as Parylene, have a relatively small Young's modulus, e.g., around 4 Gpa. These materials may be fairly soft and pliable. After the sacrificial photoresist has dissolved, the surface tension of the acetone material may pull the relatively soft and pliable structural layer down toward the substrate. This may cause a so called stiction effect, in which the formed structure may stick to the substrate. This effect is a well-known problem in surface micromachining technology.

An attempt to solve this problem has used supercritical $CO_2$ drying to bypass the air-liquid interface and thus eliminate surface tension. However, the current inventors have found limited success with such structures and techniques. Theoretical calculations have predicted a limit of 84 microns for the longest cantilevered element that could be formed in this way.

The present application, and specifically the embodiments disclosed herein, define anti stiction techniques, used for fabricating relatively large freestanding polymer MEMS structures. The techniques described in this application may be formed based on gas phase etching such as bromine trifluoride and xenon difluoride etching of certain sacrificial materials. The sacrificial materials used may include silicon and titanium. The disclosed bromine trifluoride and xenon difluoride etching are technologies that provide relatively high etching selectivity of some silicon and titanium as compared with other polymer materials such as the Parylene and the photoresist. Gas phase etching may produce the advantage of avoiding the air-liquid interface force which may be otherwise involved in the final releasing process.

Figure 1A:
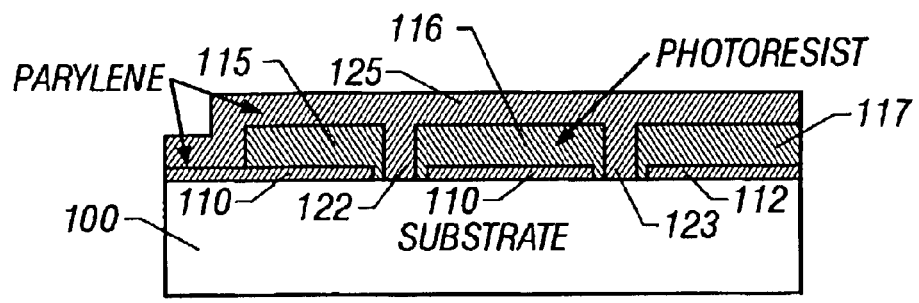
FIGS. 1A–1C show an embodiment using legs to prevents sticking.
Figure 1B:
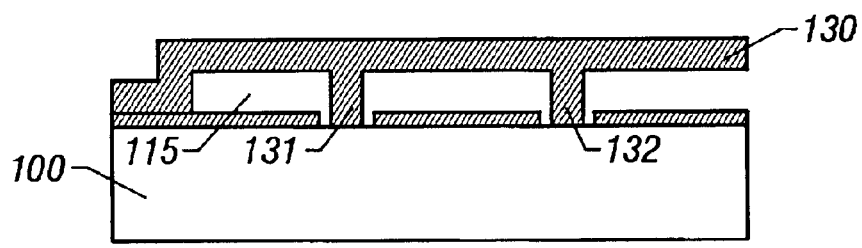
Figure 1C:
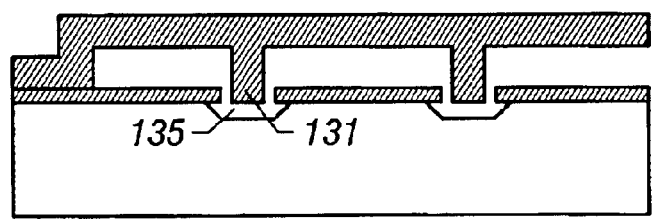

An embodiment shown in FIGS. 1A–1C. The polymer structural layer, which may be Parylene, may be formed with structural posts therein to avoid the stiction effect.

FIG. 1A shows an initial operation of preparing a substrate 100 which may be any material, e.g., silicon. The substrate may have first areas 110, 111, 112 formed thereon. These areas may be patterned using any desired techniques, such as using sacrificial photoresist.

Photoresist areas 115, 116, 117 are formed to define the cavity area(s) underlying the cantilever 130. In this embodiment, the separations between the cavity parts are formed as 122, 123. For example, the area 122 is an area where no photoresist is formed. This may be located between two of the operative areas 115, 116.

The overall structure is covered with polymer layer 125, which may be a Parylene layer. The polymer coats all of the exposed areas. This includes the areas 122 and 123, where the polymer will actually touch the substrate 100. Polymer also coats the photoresist areas 115, 116, 117. FIG. 1B illustrate the result of using acetone to dissolve the photoresist. All the areas of photoresist such as 115 are removed by the acetone, leaving open spaces where the photoresist was previously located. This leaves the polymer structure 130 generally of the shape of an expanding cantilever having structural posts, effectively forming posts 131, 132 at specified locations along the length.

During the sacrificial photoresist dissolution, these legs act as posts, holding the polymer structure above the substrate, and preventing that structure from sticking to the substrate 100.

After the photoresist areas have been removed as shown in FIG. 1B, the device may be dried. A short gas phase etching using $BrF_3$ may then be applied, to remove substrate material 135 from areas under the posts 131. An undercut hole edge by $BrF_3$ may be around 35 microns in diameter and 4.4 microns in depth. This etching frees the polymer structure and enables it to move.

The final structure shown in FIG. 1C is therefore freed, with the freed areas being allowed to move freely.

Figure 2A:
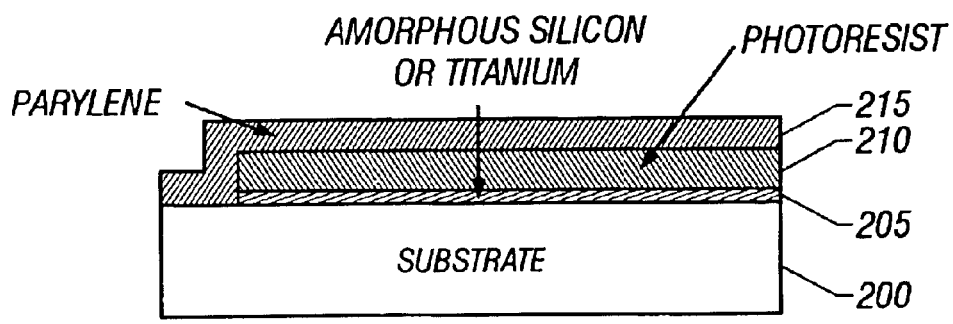
FIGS. 2A–2C show using a special sacrificial anti stick layer.
Figure 2B:
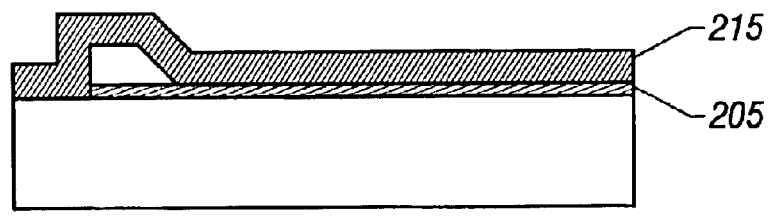
Figure 2C:
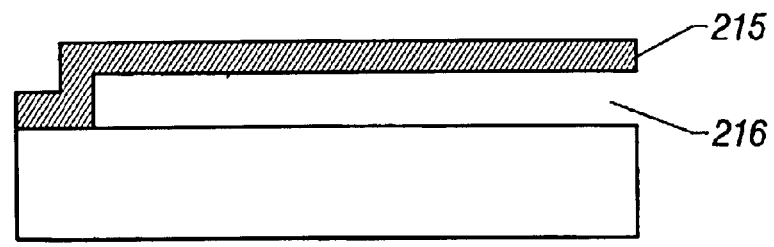

An alternative embodiment is shown in FIGS. 2A–2C, which uses an anti stick layer. FIG. 2A shows initial operations of fabrication of the polymer structure with a composite sacrificial layer. The substrate 200 may be silicon as in previous embodiments. This substrate is covered over the area that will be under the cantilever, with an anti stiction layer 205. The anti stiction layer may be amorphous silicon, or titanium. Either of these materials can be evaporated or sputtered at low temperatures. This anti stiction layer 205 may be a sacrificial layer. However, thick layers of this material may not be practical because of possible increased deposition time.

Hence, this may use a composite sacrificial layer, with a first portion of the layer 205 being an anti stiction layer 205, and a second portion 210 being formed of conventional photoresist.

As in the above embodiments, the sacrificial layers 210/205 are coated with a layer of polymer 215, which may be Parylene.

In FIG. 2B, the photoresist is dissolved away with acetone, leaving the second sacrificial layer 205. When the device is dried, the polymer structure 215 may stick down towards the substrate as shown in FIG. 2B.

In FIG. 2C, a short gas phase etching using $BrF_3$ and $XeF_3$ may operate to remove the second anti stiction layer 205. This can operate to free the polymer cantilever. FIG. 2C shows how the final polymer structure 215 may be freed from the substrate.

While the above the embodiment has disclosed a composite layer of sacrificial material, it should be understood that a single layer of sacrificial material 205 may be used especially when only a thin cavity 216 under the cantilever is desired.

Figure 3A:
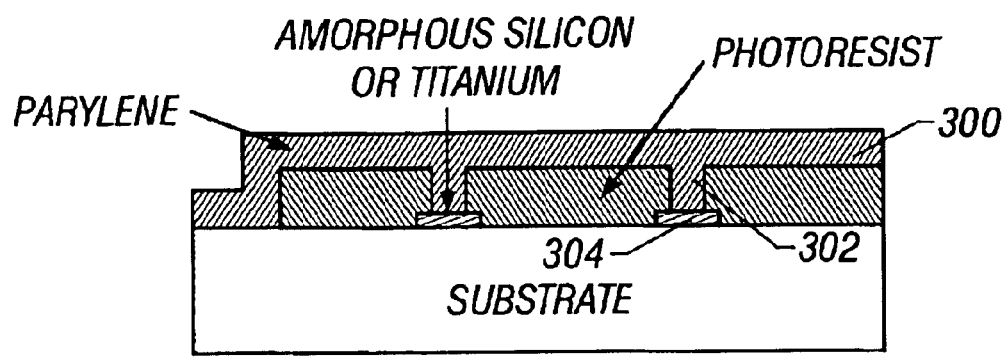
FIGS. 3A–3C show a composite embodiment.
Figure 3B:
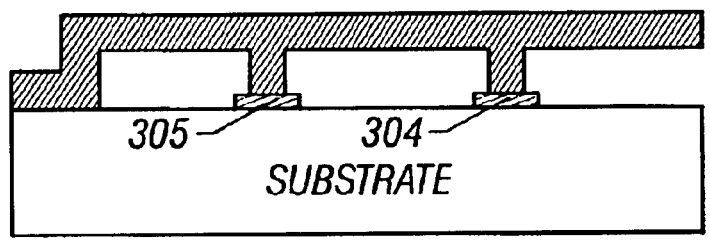
Figure 3C:
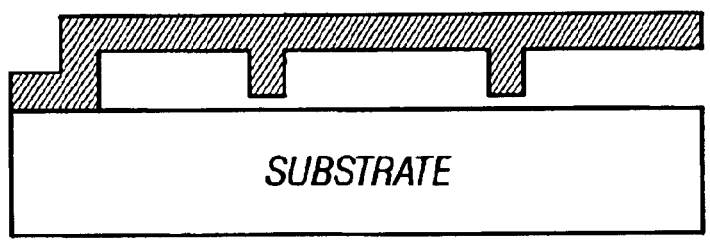

A composite embodiment is shown in FIGS. 3A–3C. In this embodiment, both technologies, that is both the posts, and the anti stick layer are combined. FIG. 3A shows fabrication of a polymer structure 300 with posts 302. Anti stick portions are located at least in portions under the posts. As an alternative, these portions may be located under the entire cantilever area.

Each post area is thus in contact with sacrificial layer 304. This sacrificial layer can be sacrificial amorphous silicon or titanium, or some other material, as above.

As in the FIG. 1 embodiment, FIG. 3B shows etching in acetone to remove the photoresist. This leaves the polymer structure 300 touching against the anti stick layer 304 at the area of the posts. In FIG. 3C, the anti stick layer 304 may be removed thus freeing the structures. The removal may use gas phase etching as described above.

The above technique has been used to form many freestanding structures of polymers. The specific polymers that are used may include Parylene. It has been found that this system may allow production of cantilevers, e.g., with about 150 microns between posts. Any beams that have widths larger than 100 microns may show stiction at the edges of the beams. Therefore, a maximum distance between the center of the post to the edge of the beam may be 75 microns.

Although only a few embodiments have been disclosed in detail above, other modifications are possible. All such modifications are intended to be encompassed within the following claims, in which:

What is claimed is:

1. A method, comprising:

forming a sacrificial layer of material on a substrate;

covering said sacrificial layer of material with a polymer material;

removing said sacrificial layer to form a cantilevered polymer structure over a substrate using micromachining techniques;

forming at least one structure between said polymer structure and said substrate which avoids said polymer structure sticking to said substrate after said removing;

forming a plurality of leg portion, extending between an extending portion of said cantilevered polymer structure, and said substrate; and an additional etching to free said leg portions from said substrate.

2. A method as in claim 1, wherein said additional etching operation comprises a gas phase etching which removes a portion of said substrate adjacent said leg portions.

3. A method as in claim 1, wherein said additional etching operation comprises etching using $BrF_3$.

4. A method as in claim 1, wherein said polymer material includes Parylene.

5. A method as in claim 1, wherein said polymer material is one with a Young's modulus of substantially 4 GPa.

6. A method as in claim 1, wherein said cantilevered polymer structure has an unsupported cantilever portion which is greater than too microns in length.

7. A method, comprising:

obtaining a silicon substrate; and forming a cantilevered polymer portion over said silicon substrate, and unsupported relative to said silicon substrate;

preventing said cantilevered polymer portion from sticking to said silicon substrate;

wherein said preventing comprises forming legs connected to said cantilevered polymer portion, said legs extending towards said silicon substrate; and wherein said forming legs comprises forming legs which extend to said substrate and may stick to said substrate, and subsequently etching to free said legs from said substrate.

8. A method as in claim 7, wherein said polymer includes Parylene.

9. A method as in claim 7, wherein said preventing comprises forming a layer that prevents said cantilevered portion from sticking to said substrate.

10. A method as in claim 9, further comprising removing said layer after preventing said cantilevered portion from sticking to said substrate.

11. A method as in claim 10, wherein said forming a layer comprises forming a layer of polysilicon.

12. A method as in claim 10, wherein said forming a layer comprises forming a layer of titanium.

13. A structure, comprising:

a silicon substrate; and a polymer cantilevered element, overlying said silicon substrate, and forming a cavity between a bottom surface of said cantilevered element and said silicon substrate, said polymer cantilevered element having a thickness less than 100 microns, and a length greater than 100 microns; and further comprising an indentation in said substrate in an area of said leg, wherein said leg is separated from said substrate.

14. A structure as in claim 13, wherein said cantilevered element further includes at least one leg thereon, which leg extends between said bottom surface of said polymer cantilevered element and said silicon substrate.

15. A structure as in claim 14, wherein said cantilevered element includes at least a plurality of legs thereon, each of which extends between said bottom surface and said silicon substrate.

16. A method, comprising:

forming a sacrificial layer of material on a substrate;

covering said sacrificial layer of material with a polymer material;

removing said sacrificial layer to form a cantilevered polymer structure over a substrate using micromachining techniques;

forming at least one structure between said polymer structure and said substrate which avoids said polymer structure sticking to said substrate after said removing;

wherein said forming at least one structure comprises forming an anti stick layer on said substrate, said anti stick layer formed of a different material than a material of said substrate;

wherein said anti stick layer is part of a sacrificial layer, and further comprising removing said sacrificial layer;

further comprising a forming a plurality of leg portions, extending between an extending portion of said cantilevered polymer structure and said substrate; and etching away portions of said substrate which abut near said leg portions.

17. A method, comprising:

obtaining a silicon substrate;

forming a cantilevered polymer portion over said silicon substrate, and unsupported relative to said silicon substrate;

preventing said cantilevered polymer portion from sticking to said silicon substrate; and wherein said etching to free said legs comprises forming removing a portion of said substrate around said legs to free the legs from the substrate.

18. A method, comprising:

obtaining a silicon substrate;

forming a cantilevered polymer portion over said silicon substrate, and unsupported relative to said silicon substrate;

preventing said cantilevered polymer portion from sticking to said silicon substrate;

wherein said etching to free said legs comprises forming removing a portion of said substrate around said legs; and wherein said etching comprises BrF3 etching to remove a portion of said substrate around said legs.

* * * * *